US006495998B1

(12) United States Patent
Terreault

(10) Patent No.: US 6,495,998 B1
(45) Date of Patent: Dec. 17, 2002

(54) SELECTABLE BAND-PASS FILTERING APPARATUS AND METHOD

(75) Inventor: Gérard Terreault, Pierrefonds (CA)

(73) Assignee: Sunrise Telecom Corp., Anjou (CA)

( * ) Notice: Subject to any disclaimer, the term of this patent is extended or adjusted under 35 U.S.C. 154(b) by 21 days.

(21) Appl. No.: 09/671,313

(22) Filed: Sep. 28, 2000

(51) Int. Cl.$^7$ .............................................. G01R 23/16
(52) U.S. Cl. ............................... 324/76.19; 324/76.31
(58) Field of Search ....................... 324/76.19, 76.31, 324/76.29, 76.45, 76.46; 327/552

(56) References Cited

U.S. PATENT DOCUMENTS

| 3,119,961 | A | | 1/1964 | Ambrose |
| 3,374,436 | A | | 3/1968 | Thiess |
| 3,789,399 | A | | 1/1974 | Blymiller et al. |
| 4,062,020 | A | | 12/1977 | Berglund |
| 4,093,989 | A | | 6/1978 | Flink et al. |
| 4,339,711 | A | | 7/1982 | Inami et al. |
| 4,459,542 | A | | 7/1984 | Terrier et al. |
| 4,673,916 | A | | 6/1987 | Kitamura et al. |
| 4,757,253 | A | | 7/1988 | Weber et al. |
| 4,789,765 | A | * | 12/1988 | Berg ........................ 200/245 |
| 4,849,721 | A | | 7/1989 | Matsuura |
| 4,894,566 | A | | 1/1990 | Rush |
| 5,446,598 | A | * | 8/1995 | Takayama ..................... 360/24 |
| 5,493,209 | A | | 2/1996 | Gumm et al. |
| 5,679,584 | A | * | 10/1997 | Mileaf et al. .................. 422/58 |
| 5,841,681 | A | * | 11/1998 | Chen et al. ............... 324/76.31 |
| 5,978,487 | A | * | 11/1999 | Kusaba ..................... 324/76.31 |
| 6,020,733 | A | | 2/2000 | Bradley |
| 6,028,647 | A | | 2/2000 | Fukai et al. |
| 6,057,723 | A | | 5/2000 | Yamaji et al. |

* cited by examiner

Primary Examiner—N. Le
Assistant Examiner—Vincent Q. Nguyen
(74) Attorney, Agent, or Firm—James Anglehart; Ogilvy Renault

(57) ABSTRACT

A selectable band-pass filtering apparatus for use at the input of analysis instrumentation, such as a spectrum analyzer for testing a multi-channel communication system, comprises a high-pass filter section including a plurality of separate high-pass filters, each characterized by a respective high-pass cut-off frequency within a predetermined input frequency spectrum characterizing the communication system and a low-pass filter section including a plurality of separate low-pass filters each characterized by a corresponding low-pass cut-off frequency within the input frequency spectrum. The apparatus further comprises switching devices capable of connecting a selected high-pass filter In series with a selected low-pass filter in order to select passband having center frequency and bandwidth characteristics defined by corresponding high-pass cut-off frequency and low-pass cut-off frequency.

19 Claims, 3 Drawing Sheets

SELECTABLE BAND-PASS FILTERING APPARATUS AND METHOD

FIELD OF THE INVENTION

The present invention relates to band-pass signal filtering, and more particularly to selectable band-pass filtering apparatus for use with spectrum analyzers for testing multi-channel communication systems.

DESCRIPTION OF PRIOR ART

Communication systems such as CATV or wireless communication systems use a multiplicity of signals that share a common physical link. In particular, CATV systems typically use up to 100 or 120 carriers on a same optical fiber or coaxial cable. Some of the instruments used to test these systems are of a wideband type, such as the spectrum analyzer, which is a broadband sweeping receiver. In order to accommodate the wideband fast sweep, the input circuitry needs also to be of a wideband type, with the result that incoming signals generate distortion products within the analyzer due to non-linear characteristics thereof, which distortion products increase with input power. These inherent distortion products being undistinguished from signal anomalies generated by the communication system under test, reliability of wideband spectrum analysis is therefore limited.

However, for some tests, the wideband capability of the spectrum analyzer is not required, because only a small portion of the available spectrum need to be analyzed. Therefore, it is usually convenient to restrict the frequency band of the signal fed to the instrument with appropriate filtering, hence minimizing input power and consequently distortion products within the instrument. Since the major distortion products are of the second and third order, these distortion products are respectively proportional to the second and third power of the incoming signals, and consequently, a reduction in input power of 1 dB increases the dynamic range between signals and associated distortion products by 1 dB and 2 dB, respectively. Several approaches have been heretofore proposed to implement such filtering. A first one uses a plurality of fixed band-pass filters that may be packaged separately or a few in a same casing, each band-pass filter having preset center-frequency and bandwidth characteristics corresponding to a single or a few communication channels. In use, the operator has to select a proper band-pass filter for the current test. A main drawback with fixed band-pass filters is that the center-frequency and band-width characteristics of each filter cannot be adjusted. A second known approach uses a tunable filter, which generally consists of a selection of band-pass filters each being tunable over a wider band such that they slightly overlap from the low end of one to the high end of the other, so that the user can select any desired channel. The control device for such tunable filter may be either mechanical or electronic. Known tunable filters available in the market place are supplied from Trilithic inc. (Indianapolis, Ind.) and K&L Microwave Inc. (Salisbury, Md.). Another type of tunable filter combines a low-pass filter section with a high-pass filter section, wherein one or both of those filter sections are made variable using different design techniques. Such tunable band-pass filter for a CATV converter is disclosed in U.S. Pat. No. 4,849,721 issued on Jul. 18, 1989 to Matsuura, which band-pass filter includes a continuously variable low-pass filter section using a variable trap analog circuit. Another tunable band-pass filter for signal noise reduction is described in U.S. Pat. No. 4,894,566 issued on Jan. 16, 1990 to Rush, which filter includes a variable high pass filter in series with a variable low-pass filter in an adaptive configuration. Although providing more flexibility for setting band-pass filter characteristics as compared to fixed band-pass filters, tunable filters are generally bulky and expensive, and therefore are not appropriate for use as a field test equipment.

SUMMARY OF THE INVENTION

It is therefore a main object of the present invention to provide a selectable band-pass filtering apparatus and method of a simple and economic design, featuring improved flexibility for setting band-pass filtering characteristics.

It is a further object of the present invention to provide a selectable band-pass filtering apparatus for use with a spectrum analyzer for testing a multi-channel communication system, featuring improved flexibility for setting band-pass filtering characteristics at the analyzer input.

It is a still further object of the present invention to provide a selectable band-pass filtering spectrum analyzer system for testing a multi-channel communication system, featuring improved flexibility for setting band-pass filtering characteristics at the input thereof.

According to the above main object, from a broad aspect of the invention, there is provided a selectable band-pass filtering apparatus comprising an input end for receiving an electrical signal to be filtered, a high-pass filter section including a plurality of separate high-pass filters each characterized by a respective high-pass cut-off frequency within a predetermined input frequency spectrum and a low-pass filter section including a plurality of separate low-pass filters each characterized by a corresponding low-pass cut-off frequency within the input frequency spectrum. The apparatus further comprises an output end, switch means capable of connecting a selected one of said high-pass filters in series with a selected one of said low-pass filters between the input and output ends to select a passband having center frequency and bandwidth characteristics defined by corresponding said high-pass cut-off frequency and said low-pass cut-off frequency, said connected filters generating a corresponding band-pass filtered signal at the output end, and a control device capable of operating said switch means according to said selected filters.

According to further broad aspect of the invention, there is provided a selectable band-pass filtering apparatus for use with a spectrum analyzer for testing a multi-channel communication system. The apparatus comprises an input end for receiving a communication signal to be filtered, a high-pass filter section including a plurality of separate high-pass filters each characterized by a respective high-pass cut-off frequency within a predetermined input frequency spectrum characterizing the communication system, and a low-pass filter section including a plurality of separate low-pass filters each characterized by a corresponding low-pass cut-off frequency within the input frequency spectrum. The apparatus further comprises an output end to be coupled to an input of the spectrum analyzer, switch means capable of connecting a selected one of said high-pass filters in series with a selected one of said low-pass filters between said input and output ends to select a passband having center frequency and bandwidth characteristics being defined by corresponding said high-pass cut-off frequency and said low-pass cut-off frequency, said selected passband characteristics corresponding to one or more selected channels used by the communication system, said connected filters generating a band-pass filtered communication signal corresponding to the selected channels at the output end, and a control device capable of operating said switch means according to the selected filters.

According to a still further broad aspect of the invention, there is provided a selectable band-pass filtering spectrum analyzer system for testing a multi-channel communication system. The spectrum analyzer system comprises a selectable band-pass filtering unit including an input end for receiving a communication signal to be filtered, a high-pass filter section including a plurality of separate high-pass filters each characterized by a respective high-pass cut-off frequency within a predetermined input frequency spectrum characterizing the communication system and a low-pass filter section including a plurality of separate low-pass filters each characterized by a corresponding high-pass cut-off frequency within the input frequency spectrum. The filtering unit further includes an output end, switch means capable of connecting a selected one of said high-pass filters in series with a selected one of said low-pass filters between the input and output ends to select a passband having center frequency and bandwidth characteristics defined by corresponding said high-pass cut-off frequency and said low-pass cut-off frequency, said selected passband characteristics corresponding to one or more selected channels used by the communication system, said connected filters generating a band-pass filtered communication signal corresponding to the selected channels at the output end, and a control device capable of operating said switch means according to the selected filters. The spectrum analyzer system further comprises a spectrum analyzer unit for analyzing the filtered communication signal.

According to a still further broad aspect of the invention, there is provided a method for selectively band-pass filtering an electrical signal, said method comprising the step of: providing a high-pass filter section including a plurality of separate high-pass filters each characterized by a respective high-pass cut-off frequency within a predetermined input frequency spectrum; providing a low-pass filter section including a plurality of separate low-pass filters each characterized by a corresponding low-pass cut-off frequency within the input frequency spectrum; and directing said signal through a selected one of said high-pass filters and through a selected one of said low-pass filters to generate a band-pass filtered signal having frequency corresponding to a passband having center frequency and bandwidth characteristics defined by corresponding said high-pass cut-off frequency and said low-pass cut-off frequency.

According to a still further broad aspect of the invention, there is provided a method for selectively band-pass filtering a communication signal to be fed to a spectrum analyzer for testing a multi-channel communication system. The method comprises the steps of: providing a high-pass filter section including a plurality of separate high-pass filters each characterized by a respective high-pass cut-off frequency within a predetermined input frequency spectrum characterizing said communication system; providing a low-pass filter section including a plurality of separate low-pass filters each characterized by a corresponding low-pass cut-off frequency within the input frequency spectrum; and directing said signal through a selected one of said high-pass filters and through a selected one of said low-pass filters to generate a band-pass filtered communication signal corresponding to one or more selected channels and having frequency characteristics corresponding to a selected passband having center frequency and bandwidth characteristics defined by corresponding said high-pass cut-off frequency and said low-pass cut-off frequency.

According to a still further broad aspect of the invention, there is provided a method for spectrally analyzing a communication signal supplied by a multi-channel communication system. The method comprises the steps of: providing a high-pass filter section including a plurality of separate high-pass filters each characterized by a respective high-pass cut-off frequency within a predetermined input frequency spectrum characterizing the communication system; providing a low-pass filter section including a plurality of separate low-pass filters each characterized by a corresponding low-pass cut-off frequency within the input frequency spectrum; directing said signal through a selected one of said high-pass filters and through a selected one of said low-pass filters to generate a band-pass filtered communication signal corresponding to one or more selected channels and having frequency characteristics corresponding to a selected passband having center-frequency and bandwidth characteristics defined by corresponding said high-pass cut-off frequency and said low-pass cut-off frequency; and spectrally analyzing the band-pass filtered communication signal.

BRIEF DESCRIPTION OF THE DRAWINGS

Preferred embodiments of an apparatus and method according to the present invention will be hereinafter described in detail with reference to the accompanying drawings in which.

DETAILED DESCRIPTION OF THE PREFERRED EMBODIMENTS

Figure 1A:
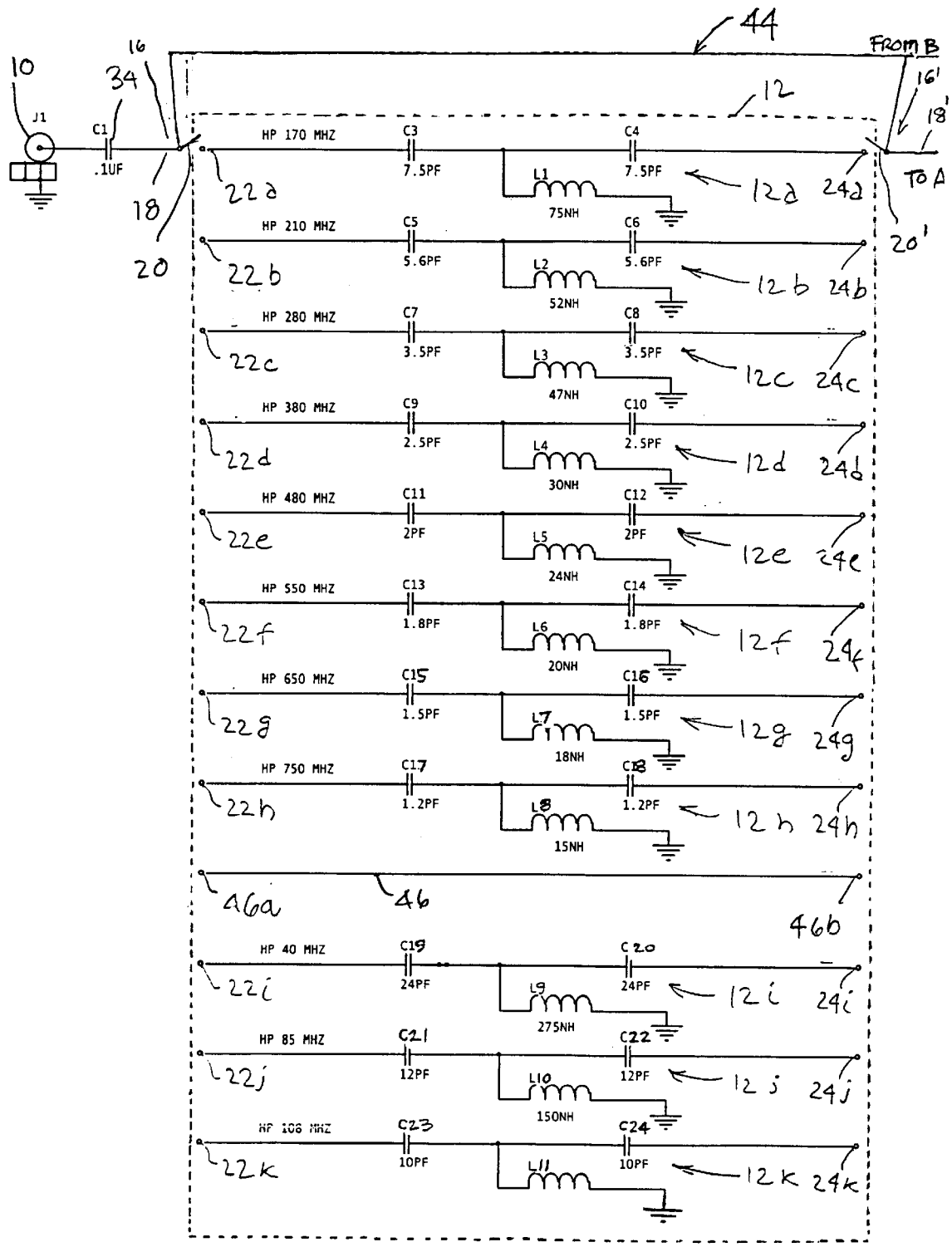
FIG. 1a is a high-pass filter section provided on a main embodiment of a band-pass filtering apparatus according to the invention.

Referring to FIG. 1a, at an input end of the selectable band-pass filtering apparatus according to the invention, is an input junction 10 receiving an incoming electrical signal to be filtered, such as a multi-channel communication signal supplied by a CATV communication network to be tested. The apparatus comprises a high-pass filter section generally designated at 12, which section includes a plurality of separate high-pass filters designated from 12a to 12k. Conveniently, the high-pass filters 12a to 12k are third order, LC filters having two capacitors in series and a mid-position inductor in shunt. The respective values for the inductor and capacitors of each one of high pass filters 12a–12k are chosen to obtain a respective high-pass cut-off frequency characterizing each filter 12a–12k within a predetermined input frequency spectrum, according to the target application. It is to be understood that the particular electronic design of high-pass filters is in no way limited to the third order LC type. The response curves of the specific high-pass filters 12a–12k used in the example of FIG. 1 are generally designated at 13 on the lower part of the graph shown in FIG. 2, which curves 13 corresponds to the high-pass cut-off frequency values appearing at second column of Table 1, which values have been chosen for a typical CATV application. It is to be understood that the number of high-pass filters included in high-pass filter section 12 is chosen according to the needs of the target applications, and therefore is not limited to the eleven filters 12a–12k used in the present example.

TABLE 1

| Filter | High-pass cutoff frequency MHz | Filter | Low-pass cutoff frequency MHz |
| --- | --- | --- | --- |
| 12i | 40 | 14i | 50 |
| 12j | 85 | 14j | 90 |
| 12k | 108 | 14k | 108 |
| 12a | 170 | 14a | 180 |
| 12b | 210 | 14b | 220 |
| 12c | 280 | 14c | 290 |
| 12d | 380 | 14d | 390 |
| 12e | 480 | 14e | 490 |
| 12f | 550 | 14f | 570 |
| 12g | 650 | 14g | 670 |
| 12h | 750 | 14h | 770 |

Figure 1B:
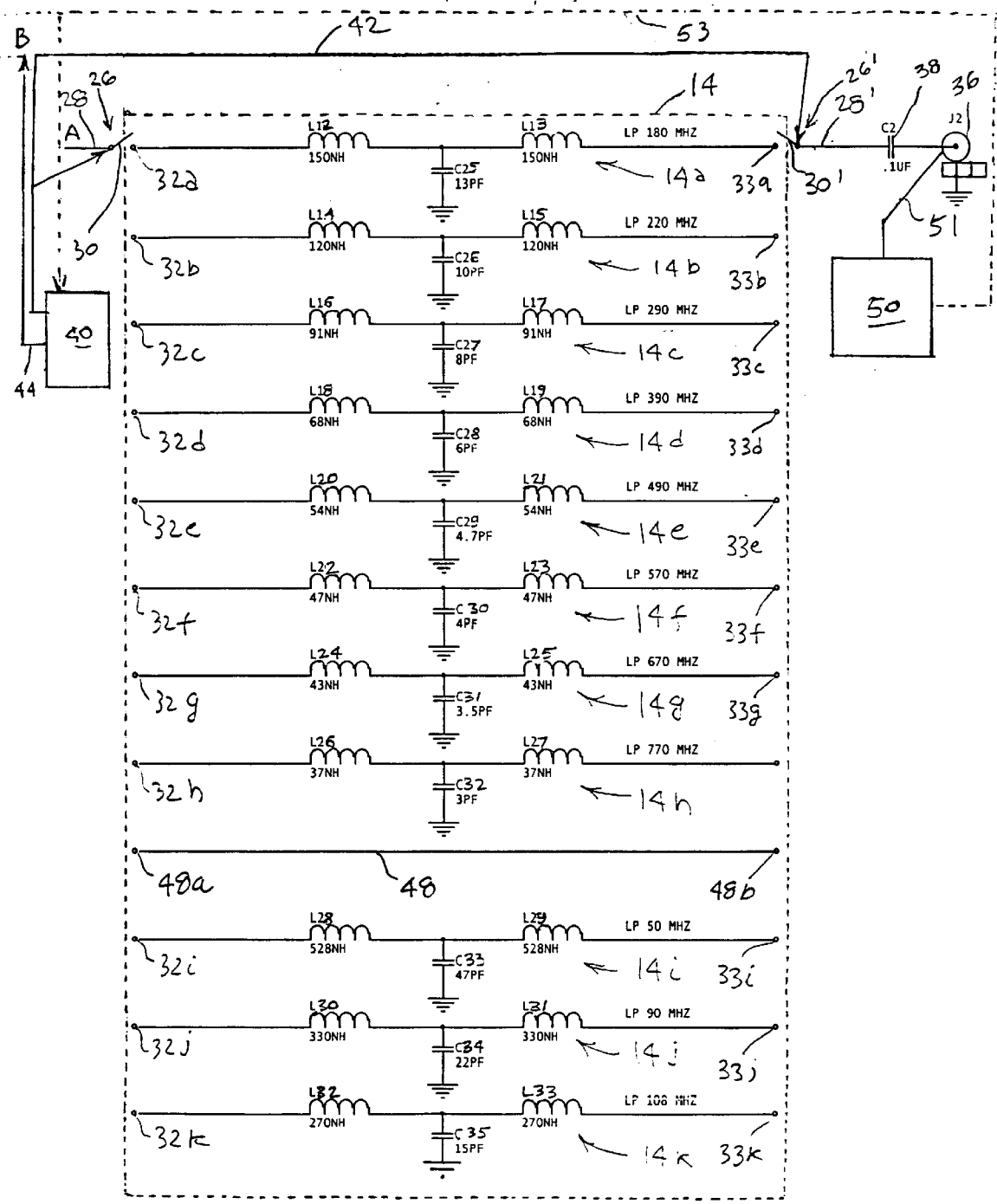
FIG. 1b is a low-pass filter section provided on the main embodiment with its band-pass filter output connected at the input of a spectrum analyzer unit.

Tuning now to FIG. 1b, the apparatus further comprises a low-pass filter section generally designated at 14, each including a plurality of separate low-pass filters designated from 14a to 14k. Conveniently, the low-pass filters 14a to 14k are third order, LC low-pass filters having two inductors in series and a mid-position capacitor in shunt. The respective values for the capacitor and inductors of each one of low-pass filters 14a–14k are chosen to obtain a respective low-pass cut-off frequency characterizing each filter 14a–14k, within the same predetermined input frequency spectrum as referred to with respect to high-pass filter section 12. It is to be understood that the particular electronic design of low-pass filters 14a–14k is in no way limited to the third order LC type. The response curves of the specific low-pass filters 14a–14k used in the example of FIG. 1 are generally designated at 15 on the upper part of the graph shown in FIG. 2, which curves 15 corresponds to the low-pass cut-off frequency values appearing at fourth column of Table 1, which values have been chosen for a typical CATV application. Turning back to FIG. 1a, the filtering apparatus further comprises a switch arrangement including a pair of high-pass switching devices 16, 16' each having a fixed terminal 18, 18' and a controlled terminal 20, 20'. In the embodiment shown, the controlled terminal 20 is capable of contacting one of input terminals 22a to 22k provided on a selected one of high-pass filters 12a to 12k, whereas the controlled terminal 20' is capable of contacting one of output terminals 24a to 24k provided on the same selected high-pass filter. Referring now to FIG. 1b, the switch arrangement further includes a pair of low-pass switching devices 26, 26' each having a fixed terminal 28, 28' and a controlled terminal 30, 30'. In the embodiment shown, the controlled terminal 30 is capable of contacting one of input terminals 32a to 32k provided on a selected one of low-pass filters 14a to 14k, whereas the controlled terminal 30' is capable of contacting one of output terminals 33a to 33k provided on the same selected low-pass filter. In the embodiment shown in FIGS. 1a and 2a, the fixed terminal 18 of high-pass switching device 16 is connected to the input junction 10 through a coupling capacitor 34, the fixed terminal 18' of high-pass switching device 16' is connected to the fixed terminal 28 of low-pass switching device 26 (as indicated by letter "A") and the fixed terminal 28' of low-pass switching device 26' is connected to an output junction 36 provided at an output end of the apparatus, through a coupling capacitor 38. The switch arrangement formed by pairs of switching devices 16,16' and 26, 26' is capable of connecting a selected one of high-pass filters 12a to 12k in series with a selected one of low-pass filters 14a to 14k between input junction 10 and output junction 36, to select a passband having center-frequency and bandwidth characteristics defined by corresponding high-pass cut-off frequency of the selected high-pass filter and low-pass cut-off frequency of the selected low-pass filter, which selected high-pass and low-pass filters so connected generates a corresponding band-pass filtered signal at output junction 36. The filtering apparatus further comprises a control device 40 as shown in FIG. 1b, which is connected to the pair of low-pass switching devices 26, 26' through a control line 42, and to the pair of high-pass switching devices 16, 16' through a control line 44, as shown in FIG. 1a. The control device 40 is capable of selectively operating pairs of switching devices 16, 16' and 26, 26' according to the selected high-pass and low-pass filters. In a portable, pocket-size embodiment of the filtering apparatus for use in field testing, the control device 40 is a manually operable control device using a pair of control knobs respectively connected to lines 42, 44 allowing manual selection of one of high-pass filters 12a to 12k and one of low-pass filters 14a to 14k. The switching devices 16, 16', 26 and 26' may be conventional 2-pole,12 throw (2P12T) mechanical switches currently available in the marketplace. Alternatively, the switching devices 16, 16, 26 and 26' may be electronically controlled switching devices, the control device 40 being of an electronic or computer-based type for providing automated tests. These electronically controlled switching devices may use relays, PIN diodes switches, Gallium Arsenide switches or any other type of switch that is sufficiently linear over the power range of the target application.

As shown in FIG. 1a, the high-pass filter section 12 is preferably provided with a short-circuit line 46 having input terminal 46a and output terminal 46b. Upon operation of the control device 40, the high-pass switching devices 16, 16' are capable of contacting the terminals 46a and 46b respectively, to bypass the high-pass filter section 12 in series with a selected low-pass filter, for generating a corresponding low-pass filtered signal at output junction 36. Similarly, the low-pass filter section 14 is preferably provided with a short-circuit line 48 having input terminal 48a and output terminal 48b. Upon operation of the control device 40, the low-pass switching devices 26, 26' are capable of contacting the terminals 48a and 48b respectively, to bypass low-pass filter section 14 in series with a selected high-pass filter, for generating a corresponding high-pass filtered signal at output junction 36.

According to a variant of the above-described embodiment, the respective positions of high-pass and low pass filter sections 12 and 14 with their respective pairs of switching devices 16, 16' and 18, 18' may be permuted, so that the fixed terminal 28 of low-pass switching device 26 is connected to input junction 10 through the coupling capacitor 34, the fixed terminal 28' of low-pass switching device 26' is connected to the fixed terminal 18 of the high-pass switching device 16, and the fixed terminal 18' of the high-pass switching device 16' is connected to output junction 36 through the coupling capacitor 38. The permutation of the filter sections 12 and 14 does not have any effect on the resulting signal filtering function performed by the apparatus. Although the selectable band-pass filtering apparatus of the present invention can be used to feed many types of analysis instrumentation, it is preferably used in combination with a spectrum analyzer 50 as shown in FIG. 2a, which has its input being connected to output junction 36 through a line 51, for testing a multi-channel communication system (not shown) from which the signal to be analyzed is received at input junction 10 shown in FIG. 1a. The spectrum analyzer 50 may be any conventional broadband sweeping receiver, preferably having a frequency range covering the full band used by the communication network under test.

According to a further embodiment of the present invention, the high-pass and low-pass filter sections 12, 14 forming a selectable band-pass filtering unit can be integrated with a spectrum analyzer unit such as spectrum analyzer 50 as shown in FIG. 1b, to form a complete selectable band-pass filtering spectrum analyzer system for testing a multi-channel communication system. In such integrated embodiment, the switching devices 16, 16, 26 and 26' are preferably electronically controlled switching devices, the control device 40 being of an electronic or computer-based type receiving control data from the spectrum analyzer 50 trough control line 53 for providing automated tests.

Figure 2:
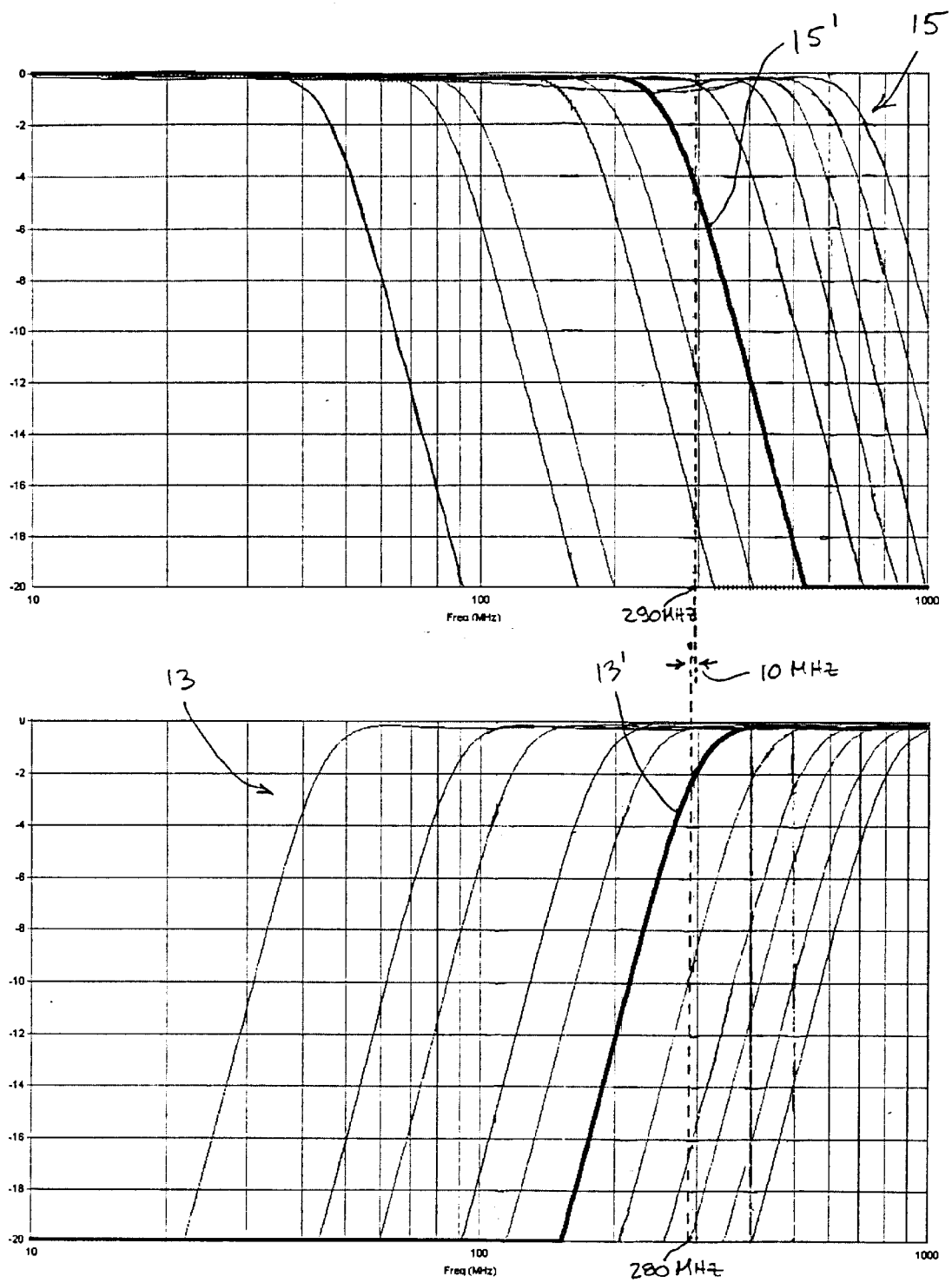
FIG. 2 is a two-part graph representing an example of respective filter response curves of the high-pass filters and low-pass filters of the filter sections of FIGS. 1a and 1b.

The method of operation of the filtering apparatus according to the invention will now be explained with reference to table 1, FIGS. 1a, 2a and 2, in the context of a multi-channel communication network testing application, wherein an input communication signal corresponding to one or more selected communication channels is to be analyzed. For a filtering apparatus provided with a manually operable control device 40, a user first manually operate the control device 40 to select an appropriate one of high-pass filters 12a–12k and an appropriate one of low-pass filters 14a–14k, to obtain band-pass filter characteristics corresponding to the selected one or more channels. For example, to analyze a channel having its center frequency at 285 MHz, high-pass filter 12c and low-pass filter 14c are selected, which filters have their respective cut-off frequency at 280 MHz and 290 MHz as indicated in table 1, and as also shown in FIG. 2 by corresponding high-pass and low-pass response curves 13' and 15', respectively. These particular cut-off frequencies define center-frequency (285 MHz) and bandwidth (10 MHz) characteristics of a bandpass filter allowing to pass the 285 MHz channel while filtering out the remaining portion of the received spectrum. For doing so, the control device 40 commands the activation of the high-pass switching device 16 to couple input junction 10 with input terminal 22c of the selected high-pass filter 12c, as well as the activation of the high-pass switching device 16' to couple output terminal 24c of the same selected high-pass filter 12c with the fixed terminal 28 of the low-pass switching device 26. In a similar way, the control device 40 commands the activation of the low-pass switching device 26 to couple output terminal 24c of the selected high-pass filter 12c with input terminal 32c of the selected low-pass filter 14c, as well as the activation of the low-pass switching device 26' to couple output terminal 33c with the output junction 36 through capacitor 38. In this manner, the input signal is directed through the selected high-pass filter 12c and through the selected low-pass filter 14c to generate a band-pass filtered communication signal corresponding to the selected 285 MHz channel, since such frequency characteristics correspond to the selected passband.

Whenever a fully low-pass filtering is desired, the user operates the control device 40 to select the short-circuit line 46, by causing the high-pass switching device 16 to couple input terminal 46a with input junction 10, while causing the high-pass switching device 16' to couple output terminal 48b with the fixed terminal 28 of low-pass switching device 26, thereby bypassing the signal directly to the selected low-pass filter. Whenever a fully high-pass filtering is desired, the user operates the control device 40 to select the short-circuit line 48, by causing the low-pass switching device 26 to couple input terminal 48a with fixed terminal 18' of high-pass switching device 16', while causing the low-pass switching device 26' to couple output terminal 48b with the output junction 36, thereby bypassing the signal as filtered by the selected high-pass filter directly to the output of the apparatus.

The resulting filtered signal produced at output junction 36 can be fed to the spectrum analyzer 50 through line 51, for signal analysis purposes. Since the spectrum analyzer receives only a selected portion of the input frequency spectrum, the remaining, filtered portion being reduced in amplitude, the total power fed to the spectrum analyzer is therefore reduced as compared to the input power fed to the filtering apparatus, improving the dynamic range between the fed signal and associated distortion products.

I claim:

1. A selectable band-pass filtering apparatus comprising:

an input end for receiving an electrical signal to be filtered;

a high-pass filter section including a plurality of separate high-pass filters each characterized by a respective high-pass cut-off frequency within a predetermined input frequency spectrum;

a low-pass filter section including a plurality of separate low-pass filters each characterized by a corresponding low-pass cut-off frequency within said input frequency spectrum;

an output end;

switch means capable of connecting a selected one of said high-pass filters in series with a selected one of said low-pass filters between said input and output ends to select a passband having center frequency and bandwidth characteristics defined by corresponding said high-pass cut-off frequency and said low-pass cut-off frequency, said connected filters generating a corresponding band-pass filtered signal at said output end; and a control device capable of operating said switch means according to said selected filters.

2. The selectable band-pass filtering apparatus as claimed in claim 1, wherein said switch means are mechanically controlled switch means, said control device being a manually operable control device.

3. The selectable band-pass filtering apparatus as claimed in claim 1, wherein said switch means are electronically controlled switch means, said control device being an electronic control device.

4. The selectable band-pass filtering apparatus as claimed in claim 1, wherein said switch means includes:

a pair of high-pass switching devices each having a fixed terminal and a controlled terminal, one said controlled terminal being capable of contacting an input terminal provided on said selected high-pass filter, the other one said controlled terminal being capable of contacting an output terminal provided on said selected high-pass filter;

a pair of low-pass switching devices each having a fixed terminal and a controlled terminal, one said controlled terminal being capable of contacting an input terminal provided on said selected low-pass filter, the other one said controlled terminal being capable of contacting an output terminal provided on said selected low-pass filter;

wherein one said fixed terminal of one said high-pass switching device is connected to one of said input end and said output end, one said fixed terminal of the other one said high-pass switching device being connected to one said fixed terminal of one said low-pass switching device, one said fixed terminal of the other one said low-pass switching device being connected to one of said output end and said input end.

5. The selectable band-pass filtering apparatus as claimed in claim 1, wherein said switch means is further capable of bypassing said high-pass filter section in series with said selected low-pass filter for generating a corresponding low-pass filtered signal at said output end, said control device being further capable of operating said switch means according to said selected low-pass filter.

6. The selectable band-pass filtering apparatus as claimed in claim 1, wherein said switch means is further capable of bypassing said low-pass filter section in series with said selected high-pass filter for generating a corresponding high-pass filtered signal at said output end, said control device being further capable of operating said switch means according to said selected high-pass filter.

7. A selectable band-pass filtering apparatus for use with a spectrum analyzer for testing a multi-channel communication system, said apparatus comprising:
   an input end for receiving a communication signal to be filtered;
   a high-pass filter section including a plurality of separate high-pass filters each characterized by a respective high-pass cut-off frequency within a predetermined input frequency spectrum characterizing said communication system;
   a low-pass filter section including a plurality of separate low-pass filters each characterized by a corresponding low-pass cut-off frequency within said input frequency spectrum;
   an output end to be coupled to an input of said spectrum analyzer;
   switch means capable of connecting a selected one of said high-pass filters in series with a selected one of said low-pass filters between said input and output ends to select a passband having center frequency and bandwidth characteristics being defined by corresponding said high-pass cut-off frequency and said low-pass cut-off frequency, said selected passband characteristics corresponding to one or more selected channels used by said communication system, said connected filters generating a band-pass filtered communication signal corresponding to said selected channels at said output end; and
   a control device capable of operating said switch means according to said selected filters.

8. The selectable band-pass filtering apparatus as claimed in claim 7, wherein said switch means are mechanically controlled switch means, said control device being a manually operable control device.

9. The selectable band-pass filtering apparatus as claimed in claim 7, wherein said switch means are electronically controlled switch means, said control device being an electronic control device.

10. The selectable band-pass filtering apparatus as claimed in claim 7, wherein said switch means is further capable of bypassing said high-pass filter section in series with said selected low-pass filter for generating a corresponding low-pass filtered signal at said output end, said control device being further capable of operating said switch means according to said selected low-pass filter.

11. The selectable band-pass filtering apparatus as claimed in claim 7, wherein said switch means is further capable of bypassing said low-pass filter section in series with said selected high-pass filter for generating a corresponding high-pass filtered signal at said output end, said control device being further capable of operating said switch means according to said selected high-pass filter.

12. A selectable band-pass filtering spectrum analyzer system for testing a multi-channel communication system, said apparatus comprising:
   a selectable band-pass filtering unit including:
      an input end for receiving a communication signal to be filtered;
      a high-pass filter section including a plurality of separate high-pass filters each characterized by a respective high-pass cut-off frequency within a predetermined input frequency spectrum characterizing said communication system;
      a low-pass filter section including a plurality of separate low-pass filters each characterized by a corresponding high-pass cut-off frequency within said input frequency spectrum;
      an output end;
      switch means capable of connecting a selected one of said high-pass filters in series with a selected one of said low-pass filters between said input and output ends to select a passband having center frequency and bandwidth characteristics defined by corresponding said high-pass cut-off frequency and said low-pass cut-off frequency, said selected passband characteristics corresponding to one or more selected channels used by said communication system, said connected filters generating a band-pass filtered communication signal corresponding to said selected channels at said output end; and
      a control device capable of operating said switch means according to said selected filters; and
   a spectrum analyzer unit for analyzing said filtered communication signal.

13. The selectable band-pass filtering spectrum analyzer system as claimed in claim 12, wherein said switch means are electronically controlled switch means, said control device being an electronic control device.

14. The selectable band-pass filtering spectrum analyzer system as claimed in claim 12, wherein said switch means includes:
   a pair of high-pass switching devices each having a fixed terminal and a controlled terminal, one said controlled terminal being capable of contacting an input terminal provided on said selected high-pass filter, the other one said controlled terminal being capable of contacting an output terminal provided on said selected high-pass filter;
   a pair of low-pass switching devices each having a fixed terminal and a controlled terminal, one said controlled terminal being capable of contacting an input terminal provided on said selected low-pass filter, the other one said controlled terminal being capable of contacting an output terminal provided on said selected low-pass filter;
   wherein one said fixed terminal of one said high-pass switching device is connected to one of said input end and said output end, one said fixed terminal of the other one said high-pass switching device being connected to one said fixed terminal of one said low-pass switching device, one said fixed terminal of the other one said low-pass switching device being connected to one of said output end and said input end.

15. The selectable band-pass filtering spectrum analyzer system as claimed in claim 12, wherein said switch means is further capable of bypassing said high-pass filter section in series with said selected low-pass filter for generating a corresponding low-pass filtered signal at said output end, said control device being further capable of operating said switch means according to said selected low-pass filter.

16. The selectable band-pass filtering spectrum analyzer system as claimed in claim 12, wherein said switch means is further capable of bypassing said low-pass filter section in series with said selected high-pass filter for generating a corresponding high-pass filtered signal at said output end, said control device being further capable of operating said switch means according to said selected high-pass filter.

17. A method for selectively band-pass filtering an electrical signal, said method comprising the step of:

providing a high-pass filter section including a plurality of separate high-pass filters each characterized by a respective high-pass cut-off frequency within a predetermined input frequency spectrum;

providing a low-pass filter section including a plurality of separate low-pass filters each characterized by a corresponding low-pass cut-off frequency within said input frequency spectrum; and directing said signal through a selected one of said high-pass filters and through a selected one of said low-pass filters to generate a band-pass filtered signal having frequency corresponding to a passband having center frequency and bandwidth characteristics defined by corresponding said high-pass cut-off frequency and said low-pass cut-off frequency.

18. A method for selectively band-pass filtering a communication signal to be fed to a spectrum analyzer for testing a multi-channel communication system, said method comprising the steps of:

providing a high-pass filter section including a plurality of separate high-pass filters each characterized by a respective high-pass cut-off frequency within a predetermined input frequency spectrum characterizing said communication system;

providing a low-pass filter section including a plurality of separate low-pass filters each characterized by a corresponding low-pass cut-off frequency within said input frequency spectrum; and directing said signal through a selected one of said high-pass filters and through a selected one of said low-pass filters to generate a band-pass filtered communication signal corresponding to one or more selected channels and having frequency characteristics corresponding to a selected passband having center frequency and bandwidth characteristics defined by corresponding said high-pass cut-off frequency and said low-pass cut-off frequency.

19. A method for spectrally analyzing a communication signal supplied by a multi-channel communication system, said method comprising the steps of:

providing a high-pass filter section including a plurality of separate high-pass filters each characterized by a respective high-pass cut-off frequency within a predetermined input frequency spectrum characterizing said communication system;

providing a low-pass filter section including a plurality of separate low-pass filters each characterized by a corresponding low-pass cut-off frequency within said input frequency spectrum;

directing said signal through a selected one of said high-pass filters and through a selected one of said low-pass filters to generate a band-pass filtered communication signal corresponding to one or more selected channels and having frequency characteristics corresponding to a selected passband having center-frequency and bandwidth characteristics defined by corresponding said high-pass cut-off frequency and said low-pass cut-off frequency; and spectrally analyzing said band-pass filtered communication signal.

\* \* \* \* \*